US007897058B2

(12) United States Patent
Van Haren et al.

(10) Patent No.: US 7,897,058 B2
(45) Date of Patent: Mar. 1, 2011

(54) DEVICE MANUFACTURING METHOD AND COMPUTER PROGRAM PRODUCT

(75) Inventors: Richard Johannes Franciscus Van Haren, Waalre (NL); Maurits Van Der Schaar, Veldhoven (NL); Ewoud Vreugdenhil, Valkenswaard (NL); Harry Sewell, Ridgefield, CT (US)

(73) Assignees: ASML Netherlands B.V., Veldhoven (NL); ASML Holding NV, Veldhoven (NL)

( * ) Notice: Subject to any disclaimer, the term of this patent is extended or adjusted under 35 U.S.C. 154(b) by 1263 days.

(21) Appl. No.: 11/435,296

(22) Filed: May 17, 2006

(65) Prior Publication Data
US 2007/0187358 A1 Aug. 16, 2007

Related U.S. Application Data

(63) Continuation-in-part of application No. 11/352,400, filed on Feb. 13, 2006, now abandoned.

(51) Int. Cl.
C23F 1/00 (2006.01)
G06F 19/00 (2006.01)
B44C 1/22 (2006.01)
G01L 21/30 (2006.01)

(52) U.S. Cl. ............................. 216/41; 216/59; 700/121
(58) Field of Classification Search .................. None
See application file for complete search history.

(56) References Cited

U.S. PATENT DOCUMENTS

| 4,496,216 | A | * | 1/1985 | Cowan | 359/566 |
|---|---|---|---|---|---|
| 5,328,810 | A | * | 7/1994 | Lowrey et al. | 430/313 |
| 5,420,067 | A | * | 5/1995 | Hsu | 438/700 |
| 5,618,383 | A | * | 4/1997 | Randall | 430/314 |
| 5,759,744 | A | * | 6/1998 | Brueck et al. | 430/312 |
| 5,795,830 | A | * | 8/1998 | Cronin et al. | 438/696 |
| 5,856,049 | A | * | 1/1999 | Lee | 430/5 |
| 6,042,998 | A | * | 3/2000 | Brueck et al. | 430/316 |
| 6,063,688 | A | * | 5/2000 | Doyle et al. | 438/424 |
| 6,204,187 | B1 | * | 3/2001 | Rupp et al. | 438/702 |
| 6,337,173 | B2 | * | 1/2002 | Jen et al. | 430/313 |
| 6,482,731 | B1 | * | 11/2002 | Juengling | 438/618 |
| 6,589,713 | B1 | | 7/2003 | Okoroanyanwu | 430/313 |
| 6,636,294 | B2 | | 10/2003 | Kochi | 355/53 |
| 6,638,441 | B2 | * | 10/2003 | Chang et al. | 216/46 |
| 6,936,899 | B2 | | 8/2005 | Juengling | 257/382 |
| 7,312,158 | B2 | * | 12/2007 | Miyagawa et al. | 438/737 |
| 7,358,140 | B2 | * | 4/2008 | Furukawa et al. | 438/266 |
| 7,476,933 | B2 | * | 1/2009 | Juengling | 257/331 |
| 7,531,456 | B2 | * | 5/2009 | Kwon et al. | 438/671 |
| 2003/0203320 | A1 | | 10/2003 | Sabnis et al. | |

OTHER PUBLICATIONS

Australian Examination Report issued on Oct. 29, 2008 in Singapore Application No. 200700939-2.

(Continued)

*Primary Examiner* — Allan Olsen
(74) *Attorney, Agent, or Firm* — Pillsbury Winthrop Shaw Pittman LLP

(57) ABSTRACT

A method of forming features, e.g. contact holes, at a higher density than is possible with conventional lithographic techniques involves forming an array of sacrificial positive features, conformally depositing a sacrificial layer so that negative features are formed interleaved with the positive features, directionally etching the sacrificial layer and removing the sacrificial features. The result is an array of holes at a higher density than the original sacrificial features. These may then be transferred into the underlying substrate using a desired process. Also, the method may be repeated to create arrays at even higher densities.

21 Claims, 13 Drawing Sheets

OTHER PUBLICATIONS

J.P. Long et al., "Edge Defined Lithography for Nano-scale III-N. Field Effect Transistors", The International Conference on Compound Semiconductor Manufacturing Technology 2005 On-line Digest, available at http:///www.gaasmantech.org/Digests/2005/index.htm, No. 14.22.

Yang-Kyu Choi et al., "A Spacer Patterning Technology for Nanoscale CMOS", IEEE Transactions on Electron Devices, vol. 49, No. 3 (Mar. 2002).

Zhaoning Yu et al., "Fabrication of Large Area 100 nm Pitch Grating by Spatial Frequency Doubling and Nanoimprint Lithography for Subwavelength Optical Applications", J. Vac. Sci. Technology. B 19(6), Nov./Dec. 2001, pp. 2816-2819.

European Search Report issued for European Patent Application No. 07250479.8-1235, dated Sep. 18, 2007.

* cited by examiner

DEVICE MANUFACTURING METHOD AND COMPUTER PROGRAM PRODUCT

RELATED APPLICATIONS

This application is a continuation-in-part of U.S. Patent Application No. 11/352,400, filed Feb. 13, 2006, now abandoned, the entire contents of which is hereby incorporated by reference.

FIELD

The present invention relates to device manufacturing methods using a lithographic apparatus, and to a computer program product.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to increase the density of devices on an integrated circuit, the pitch of lines and other features is typically reduced. However, many lithography apparatus operate at or near their resolution limits. Various process techniques have been developed to enable features smaller than the minimum size imagable by a lithography apparatus to be created. For example, United States Patent Application Publication No. US 2003/0203320 discloses the use of conformal organic polymeric films to shrink gaps in a lithography pattern.

As another example, to etch lines narrower than the width of a line in resist, the exposed resist can be treated with an electron beam, causing the remaining resist to liquefy or plasticize and flow to partially close the exposed lines. Then, lines can be etched into the underlying substrate that are narrower than the lines printed in the resist. To expose lines at a pitch smaller than the minimum pitch imagable by the lithographic apparatus, double exposure techniques can be used—a first set of lines is imaged at double the desired pitch, then a second set, complementary to the first set, is imaged again at double the desired pitch but with a positional offset equal to the desired pitch. U.S. Pat. No. 6,589,713 discloses a method using both of these techniques to print features of reduced width and pitch.

A technique not using an e-beam to print spacer gate structures at high densities is disclosed in the article "Edge Defined Lithography for Nano-scale III-N Field Effect Transistors" by J P Long et al. (published in The International Conference on Compound Semiconductor Manufacturing Technology 2005 On-line Digest, available at http://www.gaasmantech.org/Digests/2005/index.htm, no 14.22). In this technique, a sacrificial polysilicon layer is patterned using conventional photolithographic techniques to form mesas and then a thin layer of $Si_3N_4$ is conformally deposited over the entire wafer. The $Si_3N_4$ layer is then etched using a highly anisotropic Reactive Ion Etching (RIE) process to leave thin $Si_3N_4$ walls either side of the polysilicon mesas. The mesas are then removed using a wet KOH etch to leave only the $Si_3N_4$ walls, which serve as masks during subsequent etching of $SiO_2$ and polysilicon layers underneath the sacrificial polysilicon layer. The end result is thin polysilicon fins at twice the density of the mesas formed in the sacrificial polysilicon layer.

A similar technique is disclosed in "A Spacer Patterning Technology for Nanoscale CMOS" by Yang-Kyu Choi et al (published in IEEE Transactions on Electron Devices, Vol 49, No. 3, March 2002) to make silicon fins for FinFETS.

However, the disclosed techniques have limited application and may sometimes incorrectly image line-ends.

SUMMARY

It is therefore desirable to provide an improved method for manufacture of device features at higher densities.

According to an aspect of the invention, there is provided a device manufacturing method using a lithographic apparatus, the method comprising:

printing an array of sacrificial features on a first layer of a substrate, the array of sacrificial features having a first number of features per unit area;

providing a substantially conformal coating to the array of sacrificial features so as to form a first mask defining a first array of holes, the first array of holes being interleaved with the array of sacrificial features and having the first number of features per unit area;

removing the sacrificial features so as to form further holes in the first mask that, with the first array of holes, define a second array of holes having a second number of features per unit area that is double the first number of features per unit area;

providing a second mask that covers a selected part of the second array of holes; and processing a part of the first layer not covered by the first and second masks.

According to an aspect of the invention, there is provided a device manufacturing method using a lithographic apparatus, the method comprising:

patterning a first sacrificial hardmask of a substrate using the lithographic apparatus to form a first array of projecting features at a first density;

substantially conformally depositing a second sacrificial hardmask onto the first array so that an array of recessed features at the first density is formed, the recessed features being interspersed with the projecting features;

directionally etching the second sacrificial hardmask to reveal the distal surfaces of the projecting features and so that the recessed features become apertures through the second sacrificial hardmask;

selectively etching away the projecting features to leave apertures in the second sacrificial hardmask; and etching a first hardmask of the substrate through the apertures in the second sacrificial hardmask.

According to an aspect of the invention, there is provided a device manufacturing method using a lithographic apparatus, the method comprising:

patterning a first sacrificial hardmask of a substrate using the lithographic apparatus to form an array of projecting lines at a first pitch;

substantially conformally depositing a second sacrificial hardmask to bury the projecting lines and form a second array of recessed lines interleaved with the buried projecting lines;

directionally etching the second sacrificial hardmask to reveal the distal surfaces of the buried projecting lines and so that the recessed lines become apertures through the second sacrificial hardmask;

selectively etching away the buried projecting lines to leave apertures in the second sacrificial hardmask;

masking at least the ends of one or more of the apertures in the second sacrificial mask; and etching the substrate through the apertures in the second sacrificial hardmask.

According to an aspect of the invention, there is provided a device manufacturing method comprising:

printing a first array of sacrificial features at a first number of features per unit area on a first layer of a substrate;

providing a substantially conformal coating to the first array of sacrificial features so as to form a first mask defining a first array of apertures at the first number of features per unit area, the first array of apertures being interleaved with the array of sacrificial features;

removing the first array of sacrificial features so as to form further apertures in the first mask that, with the first array of apertures, define a second array of apertures at a second number of features per unit area that is double the first number of features per unit area;

filling the second array of apertures to form a second array of sacrificial features;

providing a substantially conformal coating to the second array of sacrificial features so as to form a second mask defining a third array of apertures at the second number of features per unit area, the third array of apertures being interleaved with the second array of sacrificial features; and removing the second array of sacrificial features so as to form further apertures in the second mask that, with the third array of apertures, define a fourth array of apertures at a third number of features per unit area that is double the second number of features per unit area.

According to an aspect of the invention, there is provided a computer program product comprising program code to control a lithographic cluster including a lithographic apparatus to perform a device manufacturing method comprising:

printing an array of sacrificial features at a first density on a first layer of a substrate;

providing a substantially conformal coating to the array of sacrificial features so as to form a first mask defining a first array of apertures at the first density, the first array of apertures being interleaved with the array of sacrificial features;

removing the sacrificial features so as to form further apertures in the first mask that, with the first array of apertures, define a second array of apertures at a second density that is double the first density; and processing a part of the first layer not covered by the first mask.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
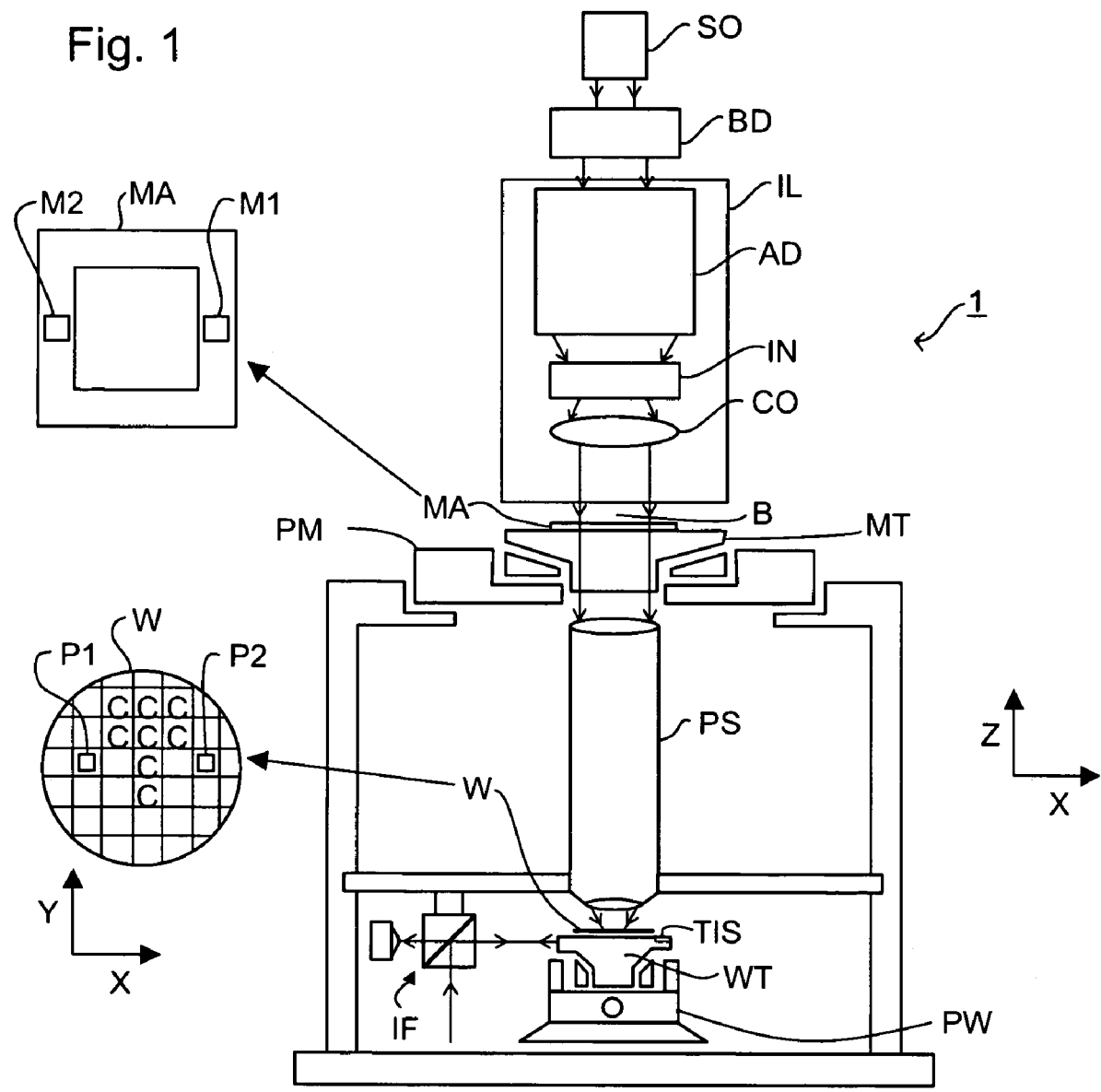
FIG. 1 depicts a lithographic apparatus usable in one or more embodiments of the invention.

FIG. 1 schematically depicts a lithographic apparatus that can be used in one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment markers M1, M2 and substrate alignment markers P1, P2. Although the substrate alignment markers as illustrated occupy dedicated target portions, they may be located in spaces between target portions (these are known as scribe-lane alignment markers). Similarly, in situations in which more than one die is provided on the patterning device MA, the patterning device alignment markers may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The lithographic apparatus may be included in a lithocluster, including process apparatus to perform steps such as etching, deposition, ion implantation, etc. or a fabrication plant or fab including such apparatus and systems to automatically transport substrates between apparatus. The cluster or fab may be under computer control.

A first method according to an embodiment of the invention is depicted in FIGS. 2 to 8, which Figures depict the substrate on which the method is performed, at various stages in the method. This method aims to print features in an array at a density higher than would normally be possible with the lithographic apparatus used. In summary, the method comprises printing a first set of sacrificial features at a density half that of ultimately desired and then covering the first set of features with a conformal coating so that a second set of features is defined by recesses interleaved with the first set of features so as to form a combined set of features having a density twice that of the first and second sets of features. Directional etching of the conformal coating to reveal the tops of the first set of sacrificial features and to deepen the second set of features through to the underlying layer, followed by selective etching of the first set of sacrificial features results in an array of apertures at the desired density. This method is described in more detail below by way of an example.

Figure 2:
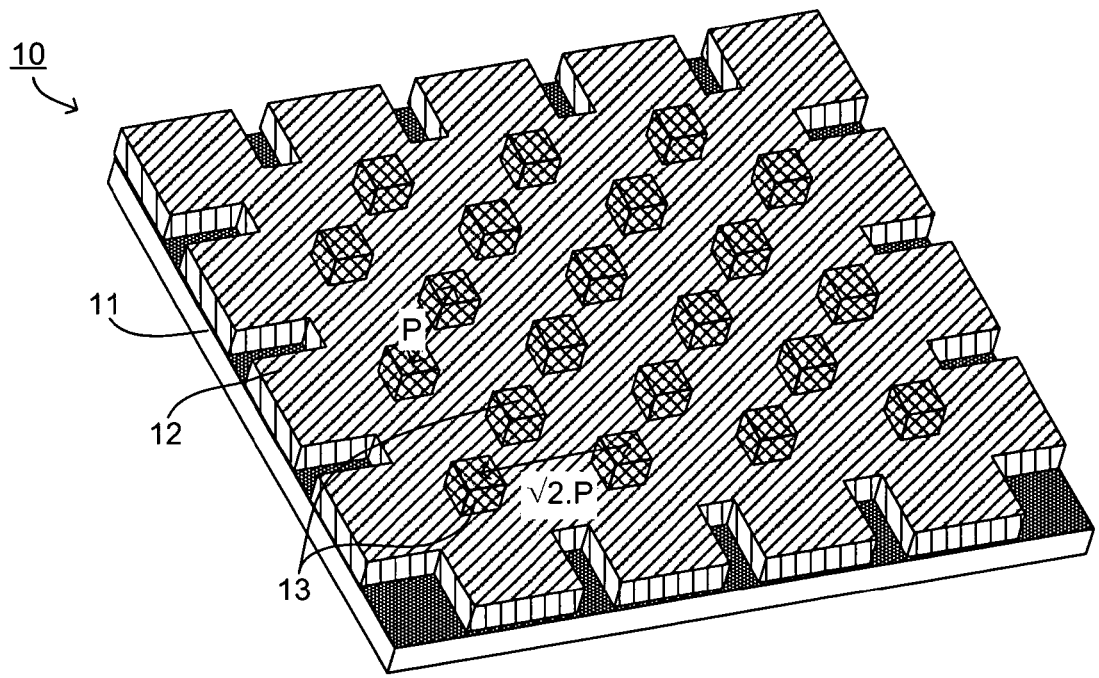
FIGS. 2 to 8 depict a substrate at various stages in the performance of a first method according to an embodiment of the invention.

The method of this embodiment of the invention aims to define an array of holes in a dielectric layer 11, which is the uppermost layer of the substrate 10, for example as contact holes. The dielectric layer 11 may lie on top of other device layers previously formed using known methods. As shown in FIG. 2, a first hardmask layer 12 is laid over the dielectric layer 11. This may be, for example, silicon carbide (SiC), particularly amorphous silicon carbide, polysilicon, SiON or diamond-like carbon (DLC) and may be blank or patterned around the edge of the area where the array of holes is to be provided. In general, the term "hardmask" is used herein to refer to any layer that is resistant to an etch process, such as a gas phase etching (which may also be referred to as plasma etching). On top of the first hardmask layer 12, an array of studs or projecting features 13 is formed; these are sacrificial features that may be formed of known hardmask materials, though, in an embodiment, a different material than the first hardmask layer 12 to enable selective etching. It should be noted that although the studs 13 in FIG. 2, and other features in subsequent Figures, are shown square, they will in fact be printed round or rounded due to the spatial filtering effects of lithographic imaging and chemical effects in process steps.

The studs 13 are set out at a spacing that is twice the spacing of the ultimately desired array and occupying half of the cells of the ultimately desired array. This can be easily understood by thinking of the ultimately desired array as a chessboard—the studs are positioned in the centers of all of the black squares. It should also be appreciated that the array need not be square, i.e. the stud spacing in two orthogonal directions need not be the same. To form an array at the highest possible density, the stud-to-stud distance P is made as small as can be patterned with the lithographic apparatus used for the patterning step in formation of the stud, hence P is substantially equal to the nominal minimum pitch of the apparatus. The distance from a stud to the next immediate stud (e.g., the stud in the horizontal or vertical direction rather than the diagonal direction as shown in FIG. 2) is $\sqrt{2}.P$. Patterning the array of studs determines the maximum density of the eventually produced array.

Figure 3:
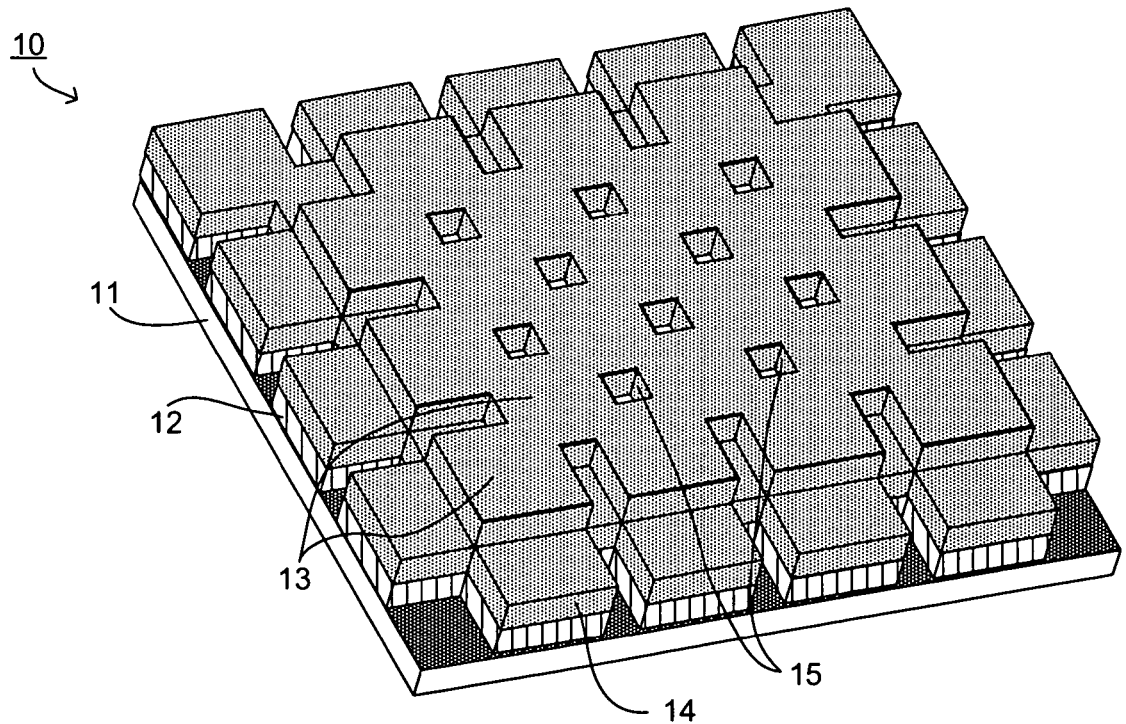

Next, as shown in FIG. 3, a conformal coating 14 is laid over the studs 13 by, for example, Plasma Enhanced Chemical Vapor Deposition (PECVD), Atomic Layer Deposition (ALD) or other known techniques. The conformal coating 14 forms a second sacrificial hardmask and may be made of known materials as mentioned above. Again, in an embodiment, the conformal coating is of a different material than the studs and/or the first hardmask layer 12 to assist in selective etching. By control of the deposition process to ensure substantially uniform growth, the conformal coating 14 builds up over and around the studs 13 until a point is reached that holes or recesses 15 are formed midway between each group of four adjacent studs 13. These recesses 15 can be regarded as negative features that, recalling the chessboard analogy, occupy the centers of the white squares. These features are self-aligned to the studs 13, so there are no overlay errors. The recesses may extend completely through the conformal coating so that the underlying layer is revealed, or may simply extend part way into the conformal coating.

Figure 4:
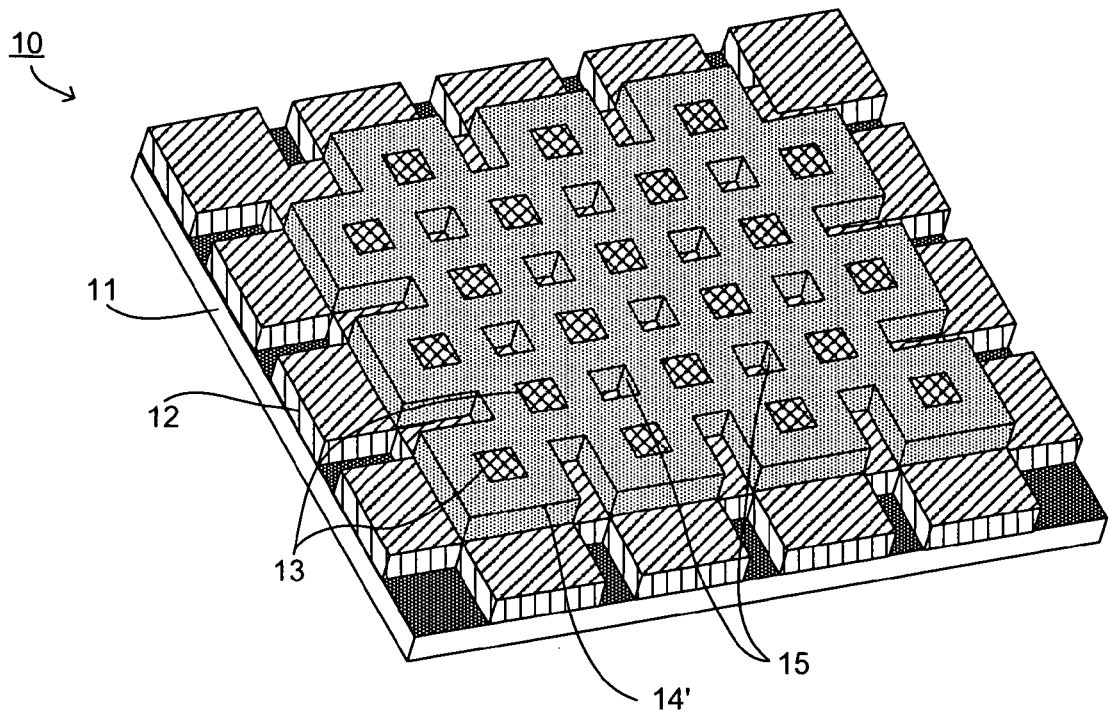

After deposition of the conformal coating 14, a controlled directional etch is performed to reach the stage shown in FIG. 4. The directional etch may be, for example, an ion-assisted etch in which ion bombardment of the substrate provides the activation energy to react the conformal coating with a gaseous etchant. Hence the etch proceeds uniformly away from the ion source. The directional etch is performed until the upper, or distal, surfaces of the studs 13 are revealed and the recesses 15 have become through-holes in the etched conformal coating 14'. The etch can be prevented from etching away the first hardmask layer 12 by control of its duration or by making the etchant selective for the conformal coating as against the first hardmask layer 12.

Figure 5:
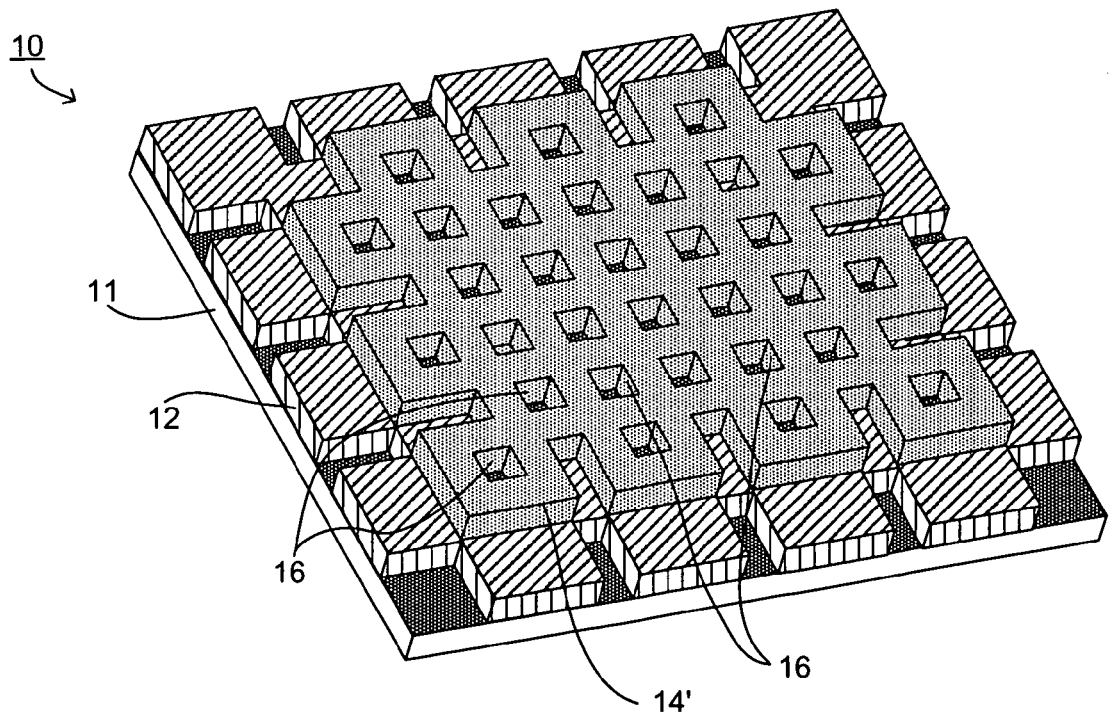
Figure 6:
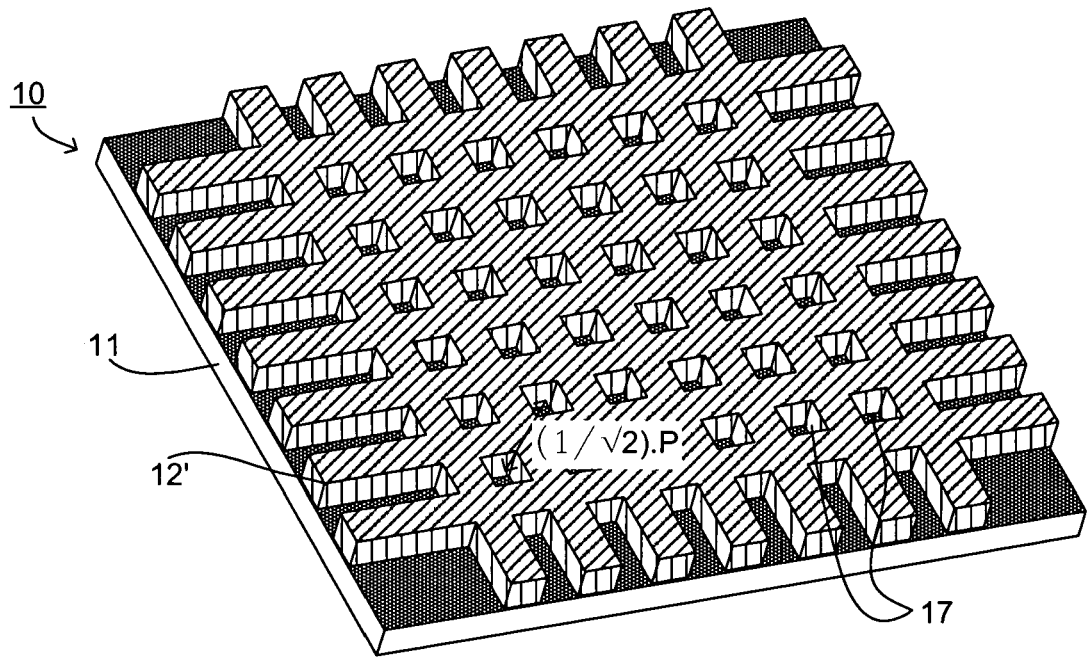

Next, a selective etch of the studs 13 as against the etched conformal coating 14' is performed to reach the result as shown in FIG. 5. The etched conformal coating 14' now has an array of apertures 16 at a density twice that of the original studs 13, in effect occupying both the black and white squares of the chessboard. Finally, the first hardmask layer 12 is etched through the etched conformal coating 14' so that the etched first hardmask layer 12', as shown in FIG. 6, has an array of apertures 17 at the desired density. Note that the spacing between apertures is $(1/\sqrt{2}).P$. The dielectric layer 11 can then be processed selectively, e.g. by etching or ion implantation or other known process, through the etched first hardmask layer 12'. In some methods of the invention, the first hardmask layer 12 can be omitted and a pattern transferred straight into the substrate by processing the apparatus at the stage shown in FIG. 5.

Figure 7:
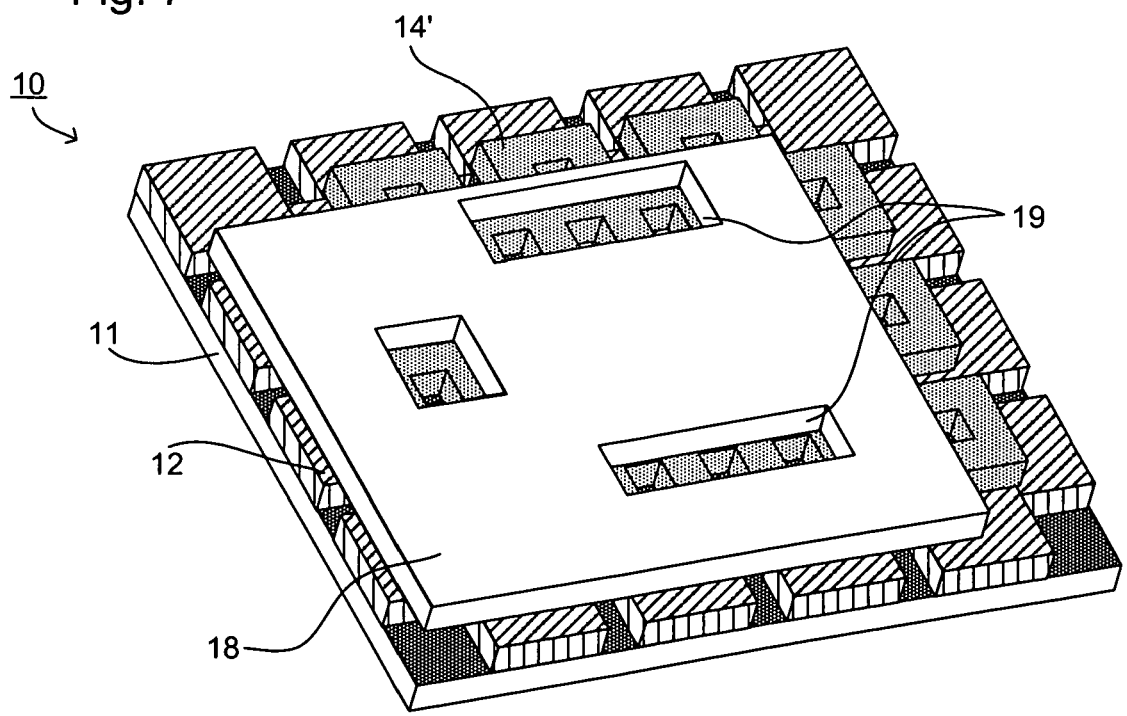
Figure 8:
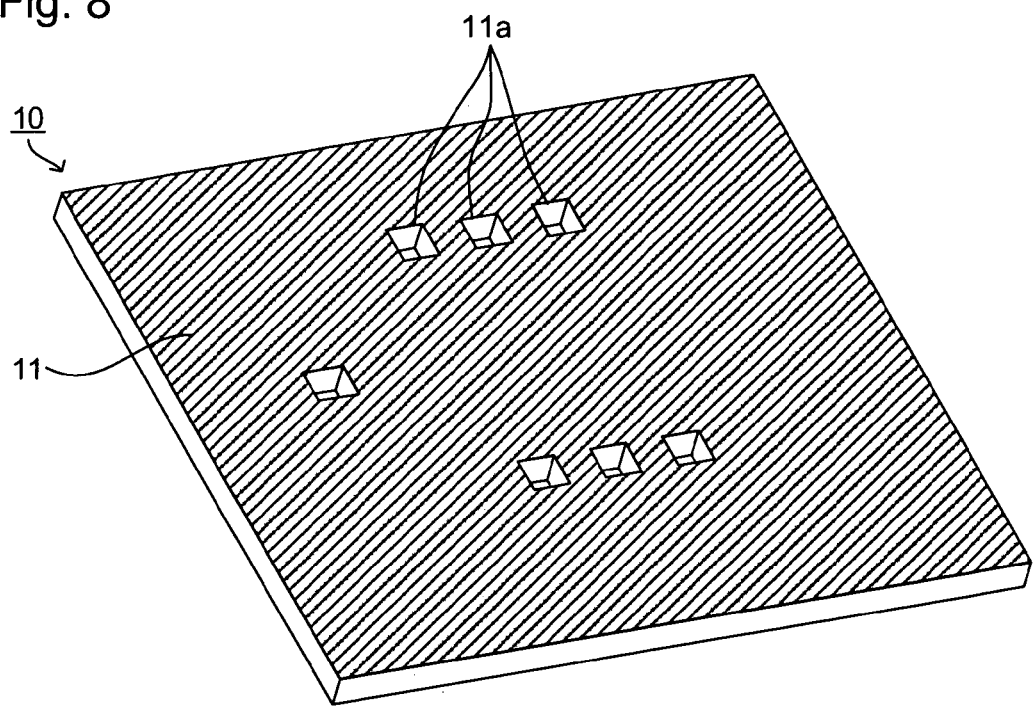
Figure 9:
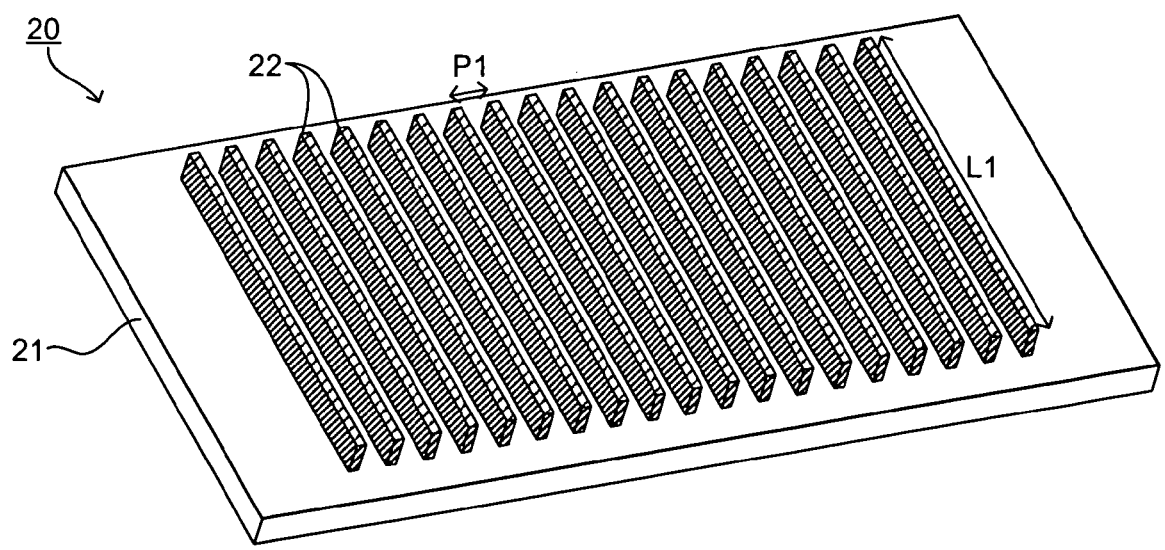
FIGS. 9 to 14 depict a substrate at various stages in performance of a second method according to an embodiment of the invention.

If it is desired only to provide structures at certain grid positions, a mask 18 can be provided during the etching of the first hardmask layer 12. As shown in FIG. 7, the mask 18 is provided over the etched conformal coating 14' and has apertures 19 at positions to reveal the apertures 16 in the etched conformal coating 14' where structures are desired. Since the apertures 19 in the mask 18 do not define the exact area of the first hardmask layer 12 that is etched, only through which of the apertures in the conformal coating 14' etching occurs, they can be larger than the apertures 16. Hence the mask 18 can be patterned in a lithography step with much less restrictive overlay and imaging requirements than the original definition of the studs 13. The mask 18 can be a simple patterned and developed resist layer. After etching the first hardmask layer 12 and through that the dielectric layer 11 with the mask 18 and removal of the first hardmask layer 12, a substrate such as illustrated in FIG. 8 can be created. This has etched holes 11a at only selected positions of the grid defined by apertures 16, but these are closer together than may be achieved by conventional lithography techniques.

A second method according to an embodiment of the invention is shown in FIGS. 9 to 14, which illustrate a substrate 20 at various stages in the method. By this method, a series of lines at a pitch half that achievable with conventional lithographic techniques can be fabricated, while at the same time ensuring that the line ends are correctly shaped. Certain lines in a series can also be omitted without affecting the adjacent remaining lines. Furthermore, the outermost lines in a block can be made uniform. These advantages can be achieved without the necessity of devoting patterning device space to optical proximity correction features, which are expensive and may increase lead time. Process details and materials that are the same as in the first embodiment and/or well known to the person skilled in the art are omitted below for the sake of brevity.

As a first step, a series of fins or projecting lines 22 are fabricated on the uppermost layer 21 of the substrate, which may be the bare substrate or the last layer deposited, depending on at what stage in the process of manufacturing a device the method of the present invention is employed and which forms a base layer for the present method. As in the first embodiment, the fins 22 are formed of a sacrificial hardmask material and are defined by a lithography step. The pitch P1 of the fins, which at the limit is determined by the capabilities of the lithography apparatus used, determines the pitch of the ultimately produced lines. Note that the fins 22 are formed with a length L1 that is longer than the length of lines that are ultimately desired to be fabricated.

Figure 10:
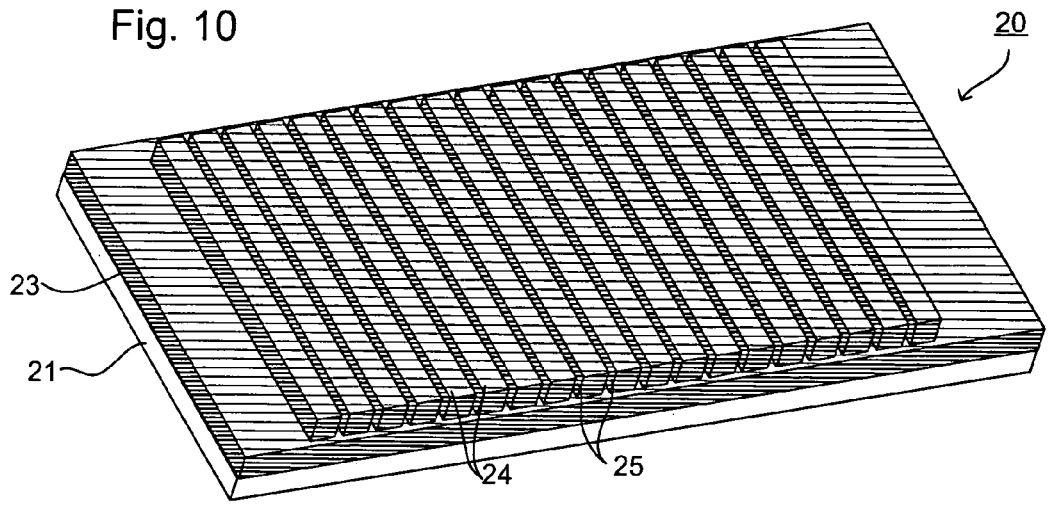

Next, a conformal coating 23, forming a second sacrificial hardmask, is deposited on top of the fins 22. As shown in FIG. 10, this forms mesas 24 covering the fins 22 but leaving alleys 25 in between, which can be regarded as negative or recessed lines. The deposition of the conformal coating 23 is controlled to ensure that the alleys 25 are of the desired width, in an embodiment similar to the width of the fins 22.

Figure 11:
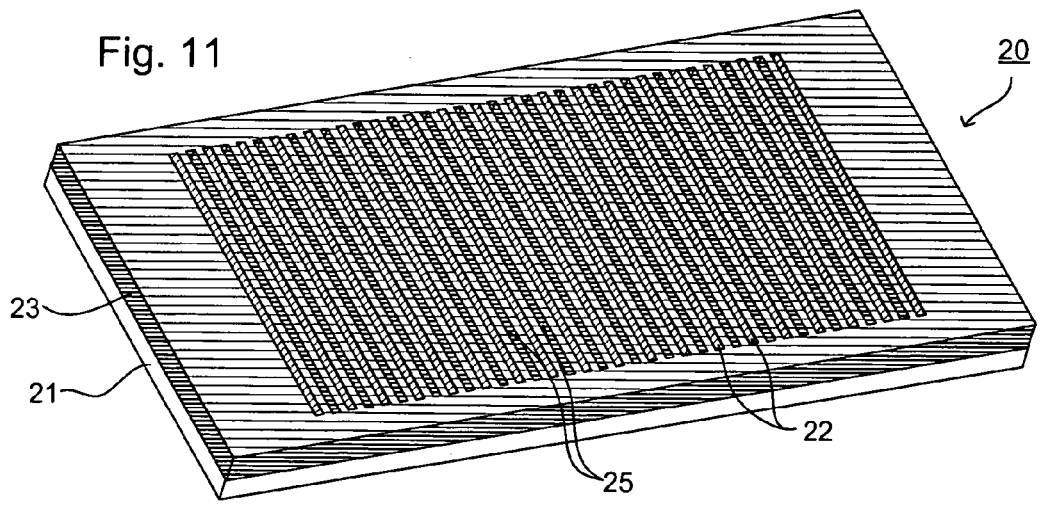
Figure 12:
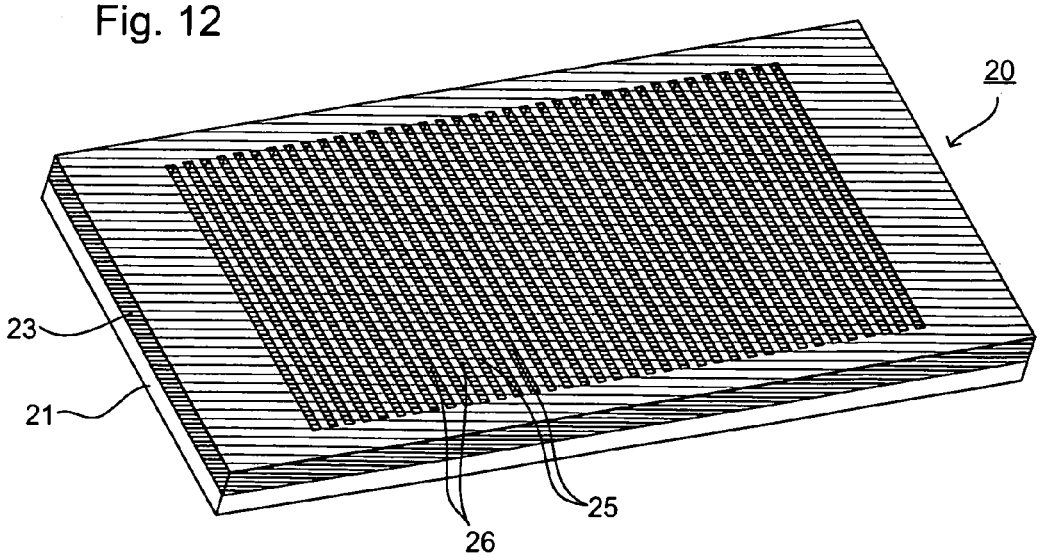

FIG. 11 shows the result of the next step, an etch of the second sacrificial hardmask 23 to reveal the tops of fins 22 and deepen alleys 25 to the top of the base layer 21. Then, a selective etch of the fins 22 as against the second sacrificial hardmask 23 gets to the stage shown in FIG. 12 where the fins 22 have been removed to form additional alleys 26 in between alleys 25.

Figure 13:
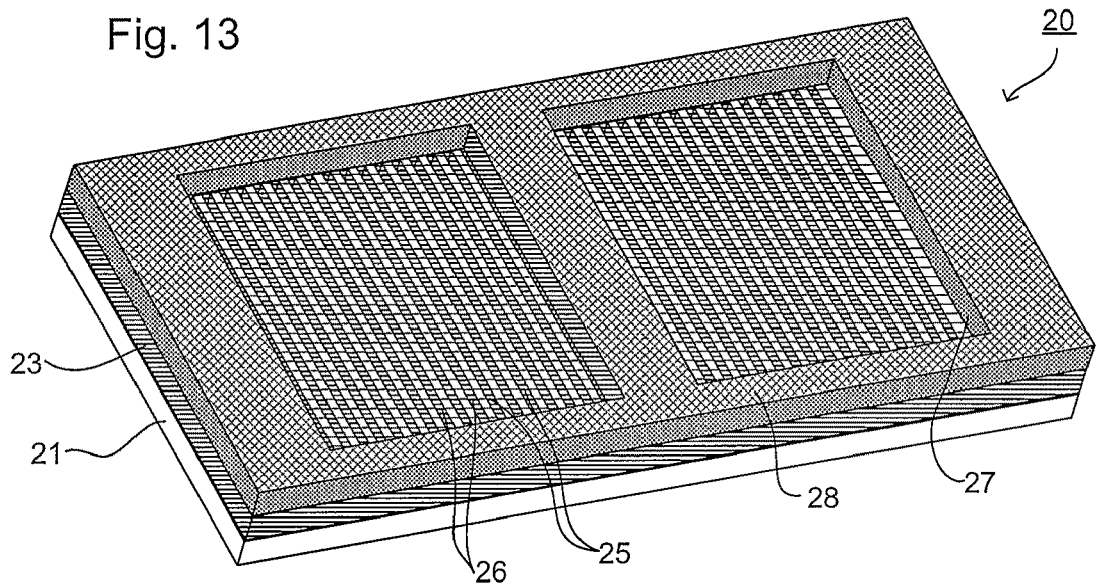
Figure 14:
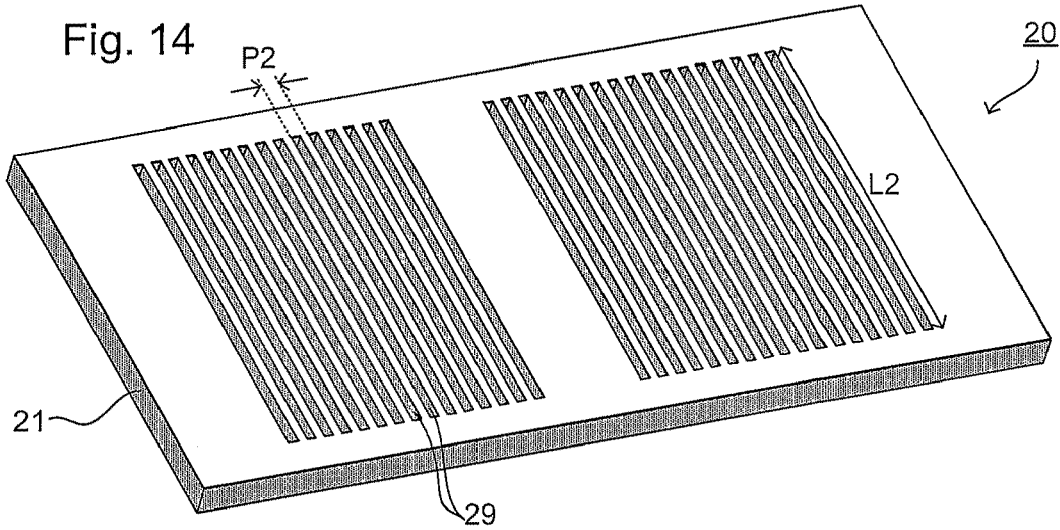

After that, a mask 28 may be provided as shown in FIG. 13. The mask 28 has windows 27 to reveal the areas where lines are desired, in other words it masks those areas where no lines are to be provided. It also masks off the line ends, controlling the ultimate line length. Since it is not particularly difficult to define a window of the required size and accuracy, the mask 28 can be patterned in a lithography step carried out on a less high resolution than that used to pattern the fins 22. At this stage, the line pattern is transferred to the base layer 21, e.g. by etching. Removal of the mask 28 and the remaining second sacrificial hardmask 23 gets to the completed layer, as shown in FIG. 14. Since the ends of the lines 29 formed in the base layer 21 by the pattern transfer step were defined by the mask 28, line end distortions as would normally occur may be low or non-existent.

Figure 15:
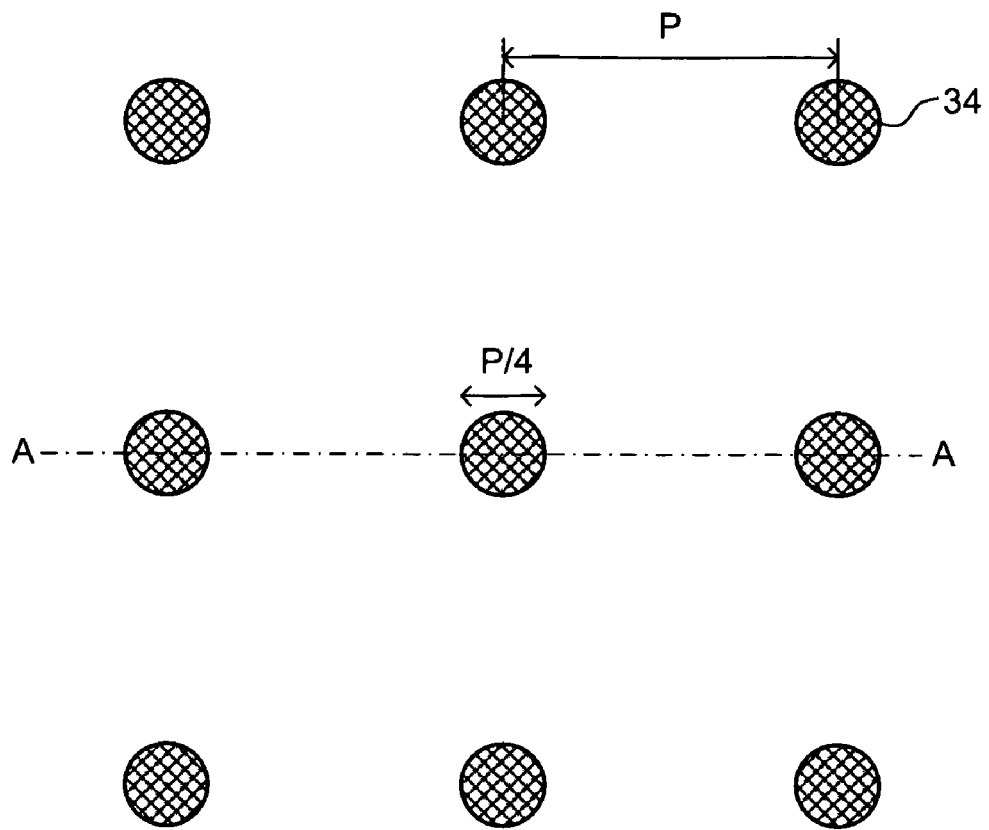
FIGS. 15 to 26 depict a substrate at various stages in performance of a third method according to an embodiment of the invention, the odd numbered Figures being plan views and the even numbered Figures being cross-sections.
Figure 16:
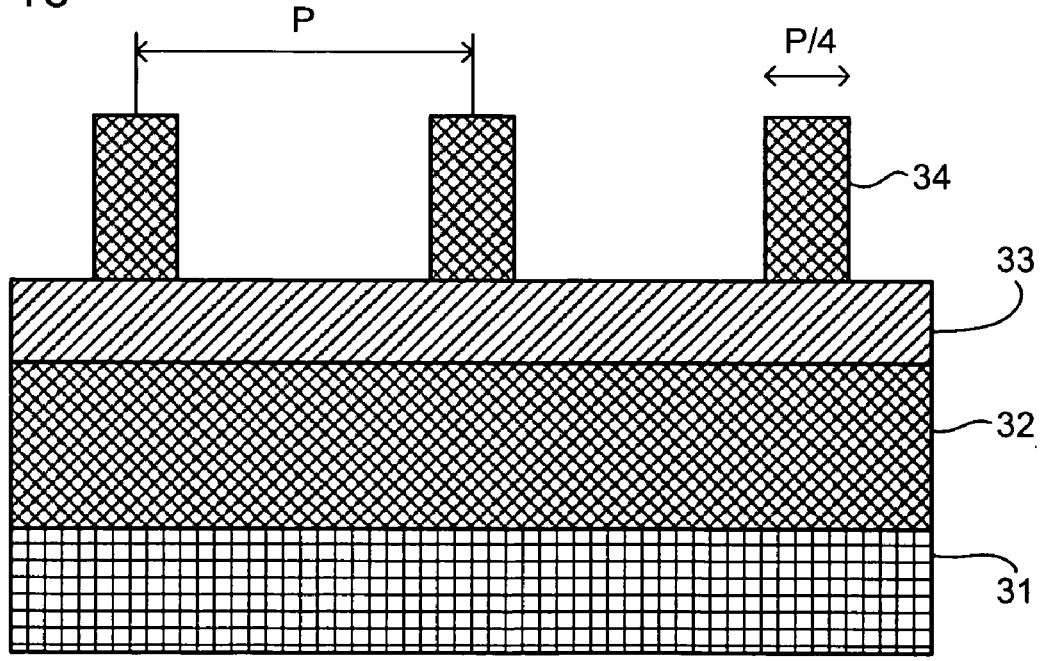

A third method according to an embodiment of the invention is now described with reference to FIGS. 15 to 26. In the third method, a substrate 31 having a first oxide layer 32 covered by a hard mask layer 33 and a second oxide layer is provided. Step 1 is a lithographic step to define a square, or orthogonal, array of resist pillars at pitch P and diameter P/2. The second oxide layer is then etched, using the resist pillars as a mask, to form oxide pillars 34. In step 2, these are then slimmed down to a diameter of P/4 using an isotropic etch process, arriving at the position shown in FIGS. 15 and 16. This array of pillars of diameter P/4 at a pitch of P could also be produced by double orthogonal exposure of lines in a positive resist or by plasma line slimming a double layer resist stack. FIG. 15 is a plan view and FIG. 16 a cross-section along line A-A of FIG. 15. As can be seen, the substrate has a square array, with pitch P, of oxide pillars 34, having a diameter of P/4, over a hardmask layer 33.

Figure 17:
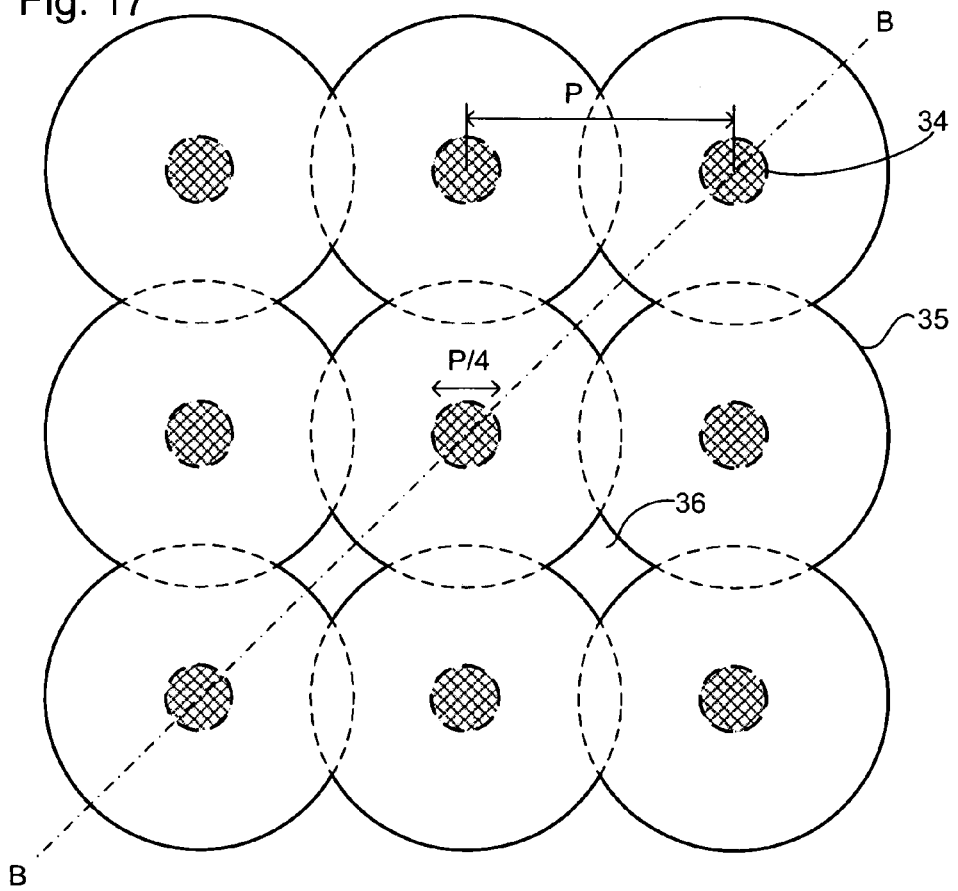
Figure 18:
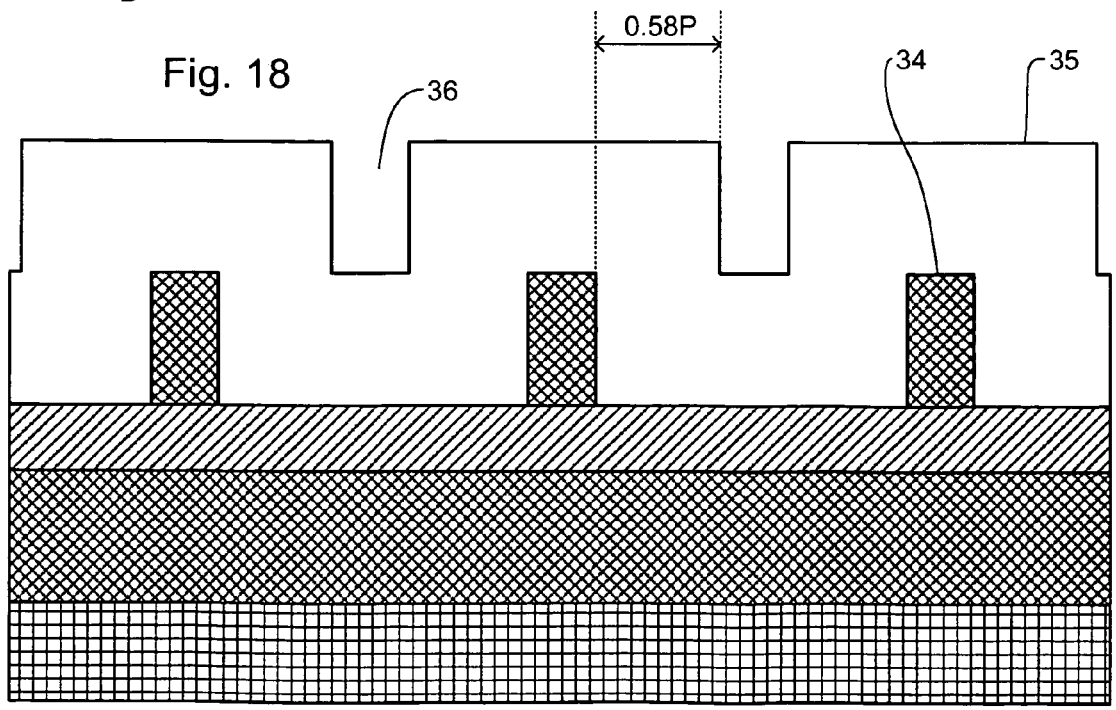

The next step, step 3, is to conformally coat the oxide pillars with a material such as polysilicon, or other coating materials as described above, e.g. by chemical vapor deposition. The coating material 35 is deposited to a depth of approximately 0.58 P and thus forms islands around the oxide pillars 34 of diameter (P/4+2×0.58 P), leaving unfilled voids 36 at the interstitial positions in the array. The interstitial voids 36 have a diameter of approximately P/4 and will tend to be rounded rather than exactly the shape left between four partly overlapping circles. This is shown in FIGS. 17 and 18 in which FIG. 17 is a plan view and FIG. 18 a cross-section along line B-B.

Figure 19:
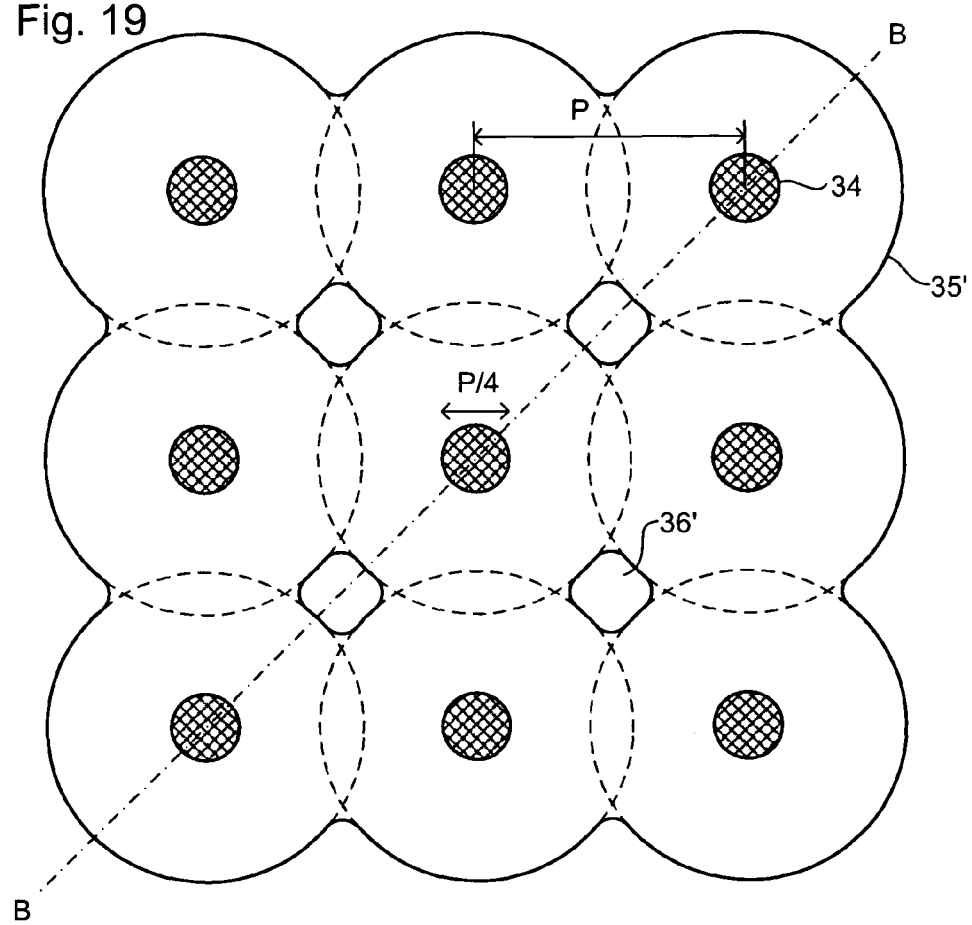
Figure 20:
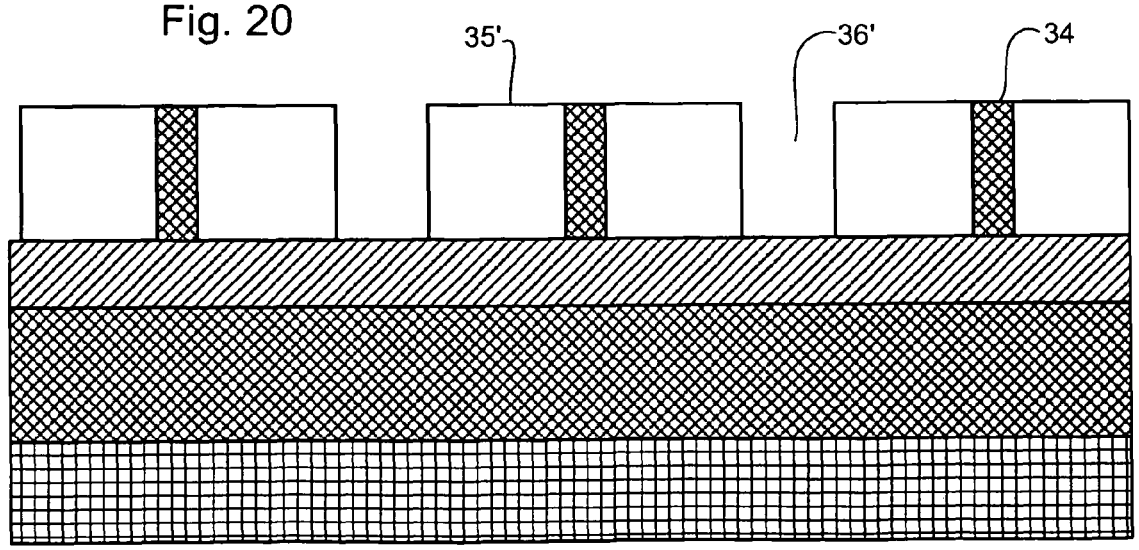

Then in step 4, an anisotropic etch, such as RIE, is performed to remove the coating material 35 above the oxide pillars 34 and at the bottom of the interstitial voids 36 to arrive at the position shown in FIGS. 19 and 20, of which FIG. 19 is a plan view and FIG. 20 a cross-section along line B-B. At this stage, the etched coating material 35' has substantially the same thickness as the oxide pillars 34 and the interstitial voids 36 now extend to the hard mask layer. 33.

Figure 21:
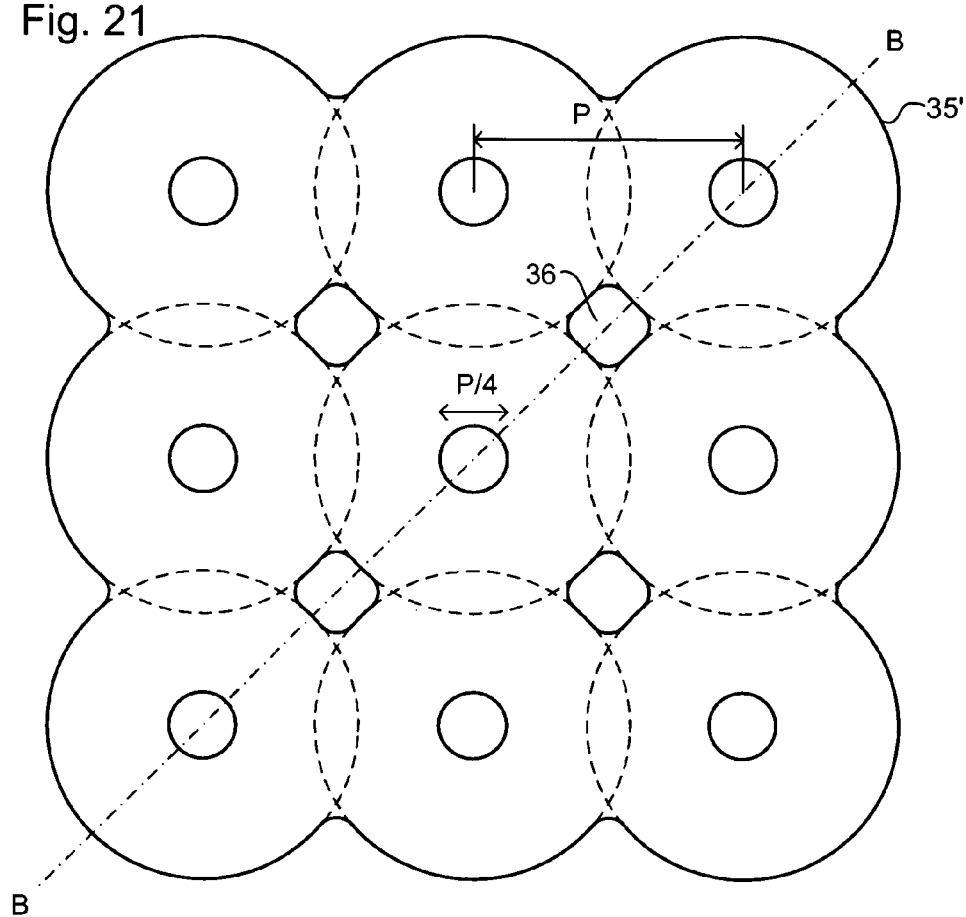
Figure 22:
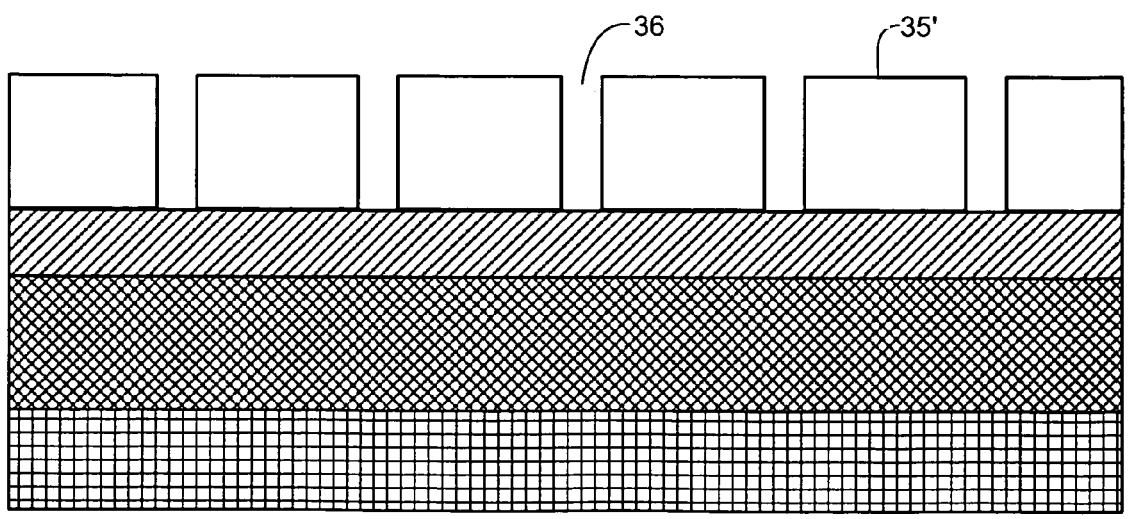

Now, the oxide pillars 34 can be etched away, step 5, with the hardmask 33 acting as an etch stop for the oxide pillars 34 and the interstitial voids 36. This etch gets us to the position shown in FIGS. 21 and 22, of which FIG. 21 is a plan view and FIG. 22 a cross-section along line B-B. There is now a single layer above the hard mask 33—the remainder of the etched coating material 35'—which has apertures on a staggered array with pitch P/√2. This layer can then be used in step 6 as a mask for an etch or other process so that the staggered array pattern is transferred into the hard mask 33, or other layer of the substrate.

Figure 23:
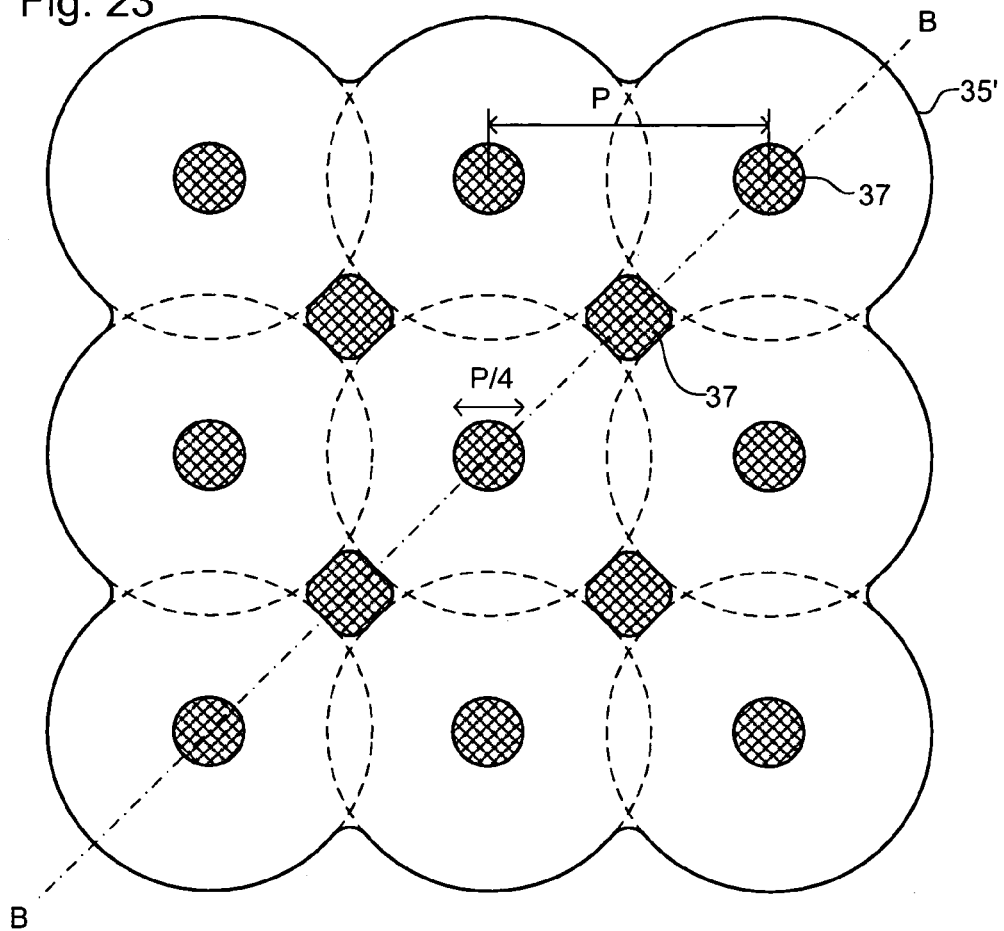
Figure 24:
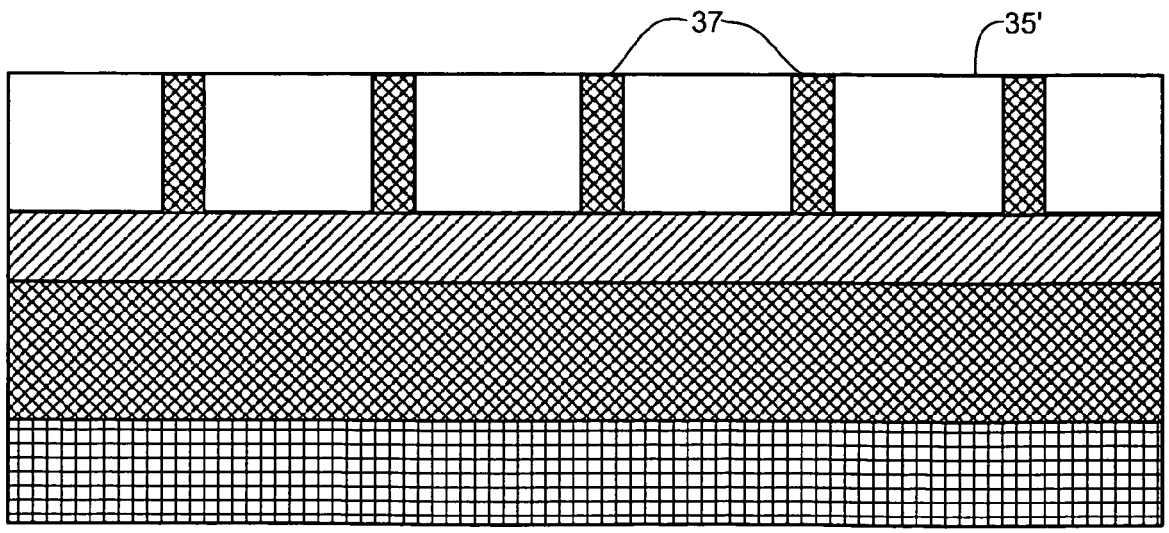
Figure 25:
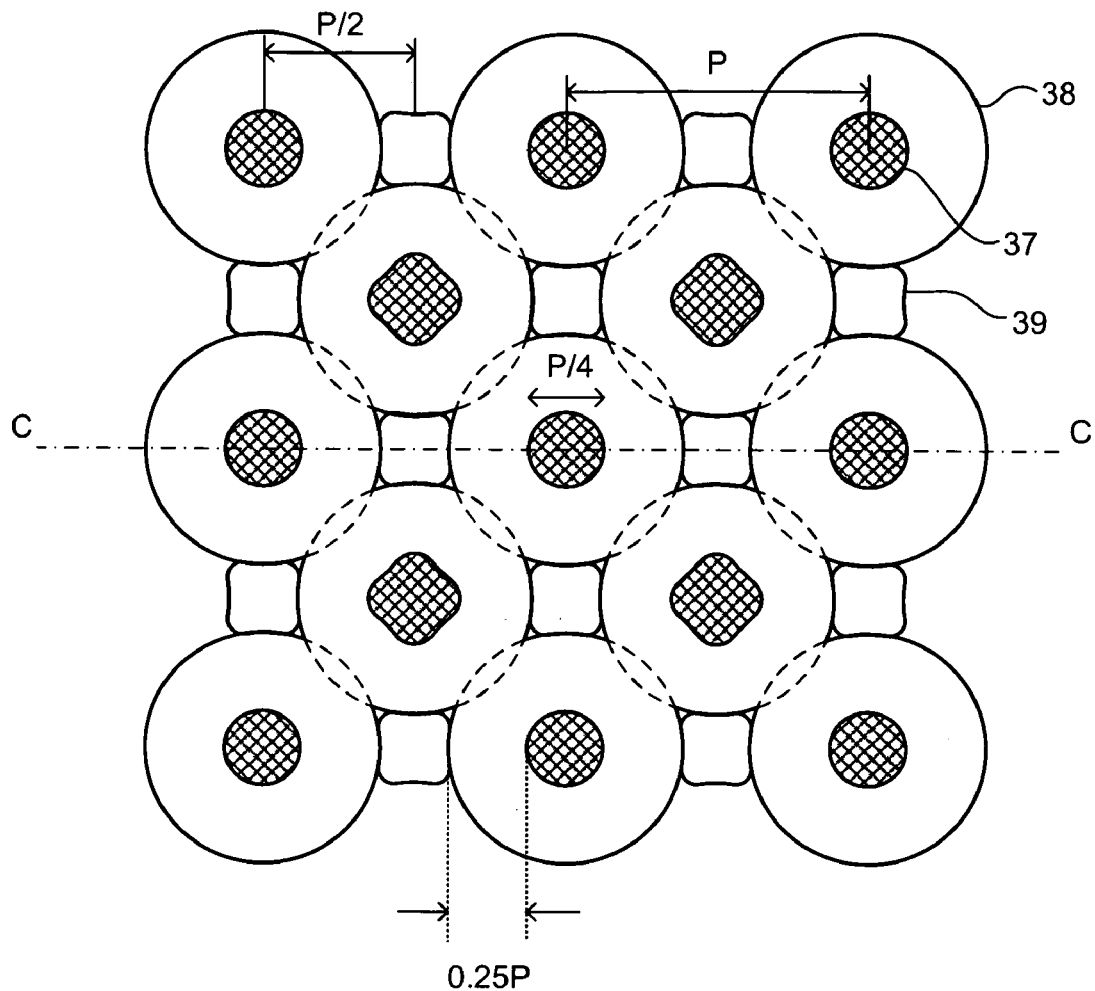
Figure 26:
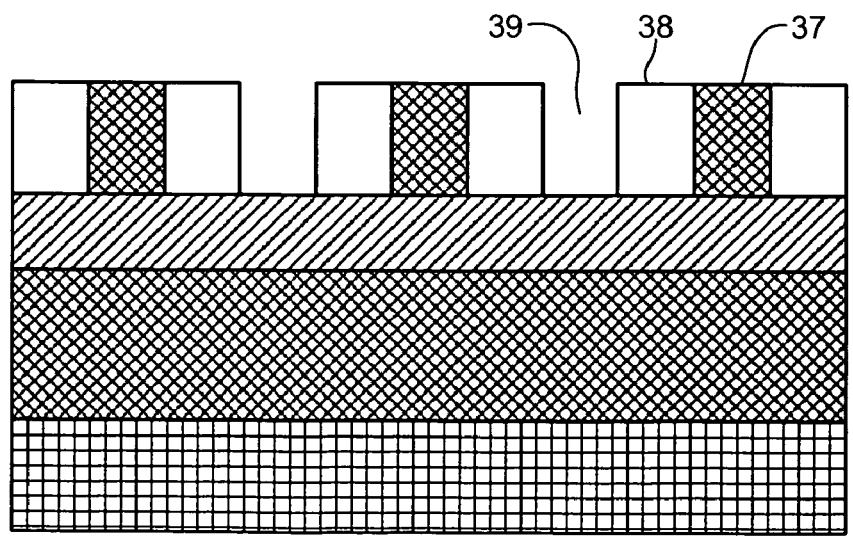

Alternatively, the method can be repeated to create a square array of pitch P/2. To do this, instead of transferring the staggered array pattern shown in FIGS. 21 and 22 into the hard mask, a coating of oxide is deposited to fill all of the voids in the etched coating material 35'. This is then planarized and etched back so that the oxide just fills the voids, as shown in FIGS. 23 and 24, of which FIG. 23 is a plan view and FIG. 24 a cross-section along line B-B. Removing the remainder of the coating 35' provides a staggered array of oxide pillars 37 with a pitch P/√2. By repeating steps 3 and 4, but with a second conformal layer 38 having a depth of approximately 0.25 P, a set of second interstitial voids 39 of diameter P/4 is created in an array of pitch P/√2, as shown in FIGS. 25 and 26. Etching away the oxide pillars 37, i.e. repeating step 5, creates a layer, the remainder of second conformal layer 38, with a square array of holes at pitch P/2. This can then be transferred into the hardmask or other layer beneath as desired. It is also possible to repeat steps 3, 4 and 5 more times to produce arrays of pitch P/(2√2), P/4, etc.

The methods of the present invention are particularly useful for the formation of contact holes and vias as well as other devices, such as DRAM, Flash RAM, embedded memory and other memory types, that require structures, for example contact holes, in regularly repeated arrays. Since the defining lithography step is carried about at half or less of the ultimately obtained pitch or feature density, it may be achieved without OPC features and may still achieve better and more consistent results. In particular, because an array of features can be extended over an area larger than the desired area, which is then cut back in a subsequent undemanding masking step, edge effects, such as differences between edge features and central features, may be avoided.

Although specific reference may be made in this text to the use of the method in the manufacture of ICs using lithographic apparatus, it should be understood that the methods described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A device manufacturing method using a lithographic apparatus, the method comprising:
   printing an array of sacrificial features on a first layer of a substrate, the array of sacrificial features having a first number of features per unit area;
   providing a substantially conformal coating to the array of sacrificial features so as to form a first mask defining a first array of holes, the first array of holes being interleaved with the array of sacrificial features and having the first number of features per unit area;
   removing the sacrificial features so as to form further holes in the first mask that, with the first array of holes, define a second array of holes having a second number of features per unit area that is double the first number of features per unit area;
   providing a second mask that is above and covers, a selected part of the second array of holes; and
   processing a part of the first layer not covered by the first and second masks.

2. The method according to claim 1, wherein providing a substantially conformal coating comprises applying a substantially conformal coating over the sacrificial features and directionally etching the substantially conformal coating to reveal surfaces of the sacrificial features.

3. The method according to claim 1, wherein the second mask is formed in developed resist.

4. The method according to claim 1, wherein the sacrificial features are studs.

5. The method according to claim 1, wherein the first array is a staggered array.

6. The method according to claim 1, wherein the second mask covers the whole of selected ones of the holes of the second array of holes.

7. The method according to claim 1, wherein the first layer is a hardmask.

8. The method according to claim 7, wherein the first layer is formed of a material selected from the group consisting of silicon carbide, polysilicon, SiON, and diamond-like carbon.

9. The method according to claim 1, wherein the first mask is a hardmask.

10. The method according to claim 9, wherein the first mask is formed of a material selected from the group consisting of silicon carbide, polysilicon, SiON, and diamond-like carbon.

11. The method according to claim 1, wherein the sacrificial features are lines.

12. The method according to claim 11, wherein the second mask covers the ends of the holes of the second array of holes.

13. The method according to claim 11, wherein the second mask covers the whole of selected ones of the holes of the second array of holes.

14. A device manufacturing method using a lithographic apparatus, the method comprising:
   patterning a first sacrificial hardmask of a substrate using the lithographic apparatus to form a first array of projecting features at a first number of features per unit area;
   substantially conformally depositing a second sacrificial hardmask onto the first arrayso that an array of recessed features at the first number of features per unit area is formed, the recessed features being interspersed with the projecting features;
   directionally etching the second sacrificial hardmask to reveal the distal surfaces of the projecting features and so that the recessed features become apertures through the second sacrificial hardmask;
   selectively etching away the projecting features to leave apertures in the second sacrificial hardmask;
   providing a resist mask above and covering, selected ones of the apertures in the second sacrificial hardmask; and
   etching a hardmask of the substrate through the apertures in the second sacrificial hardmask and the resist mask.

15. The method according to claim 14, wherein the lithographic apparatus is a lithographic projection apparatus.

16. A device manufacturing method using a lithographic apparatus, the method comprising:
   patterning a first sacrificial hardmask of a substrate using the lithographic apparatus to form an array of projecting lines at a first pitch;

substantially conformally depositing a second sacrificial hardmask to bury the projecting lines and form a second array of recessed lines interleaved with the buried projecting lines;

directionally etching the second sacrificial hardmask to reveal the distal surfaces of the buried projecting lines and so that the recessed lines become apertures through the second sacrificial hardmask;

selectively etching away the buried projecting lines to leave apertures in the second sacrificial hardmask;

masking above and over, at least the ends of one or more of the apertures in the second sacrificial mask; and etching the substrate through the masking over the ends of one or more of the apertures in the second sacrificial mask and through the apertures in the second sacrificial hardmask.

17. The method according to claim 16, wherein one or more apertures are wholly masked.

18. A device manufacturing method comprising:

printing a first array of sacrificial features at a first number of features per unit area on a first layer of a substrate;

providing a substantially conformal coating to the first array of sacrificial features so as to form a first mask defining a first array of apertures at the first number of features per unit area, the first array of apertures being interleaved with the array of sacrificial features;

removing the first array of sacrificial features so as to form further apertures in the first mask that, with the first array of apertures, define a second array of apertures at a second number of features per unit area that is double the first number of features per unit area;

filling the second array of apertures with a first material to form a second array of sacrificial features;

providing a substantially conformal coating of a second material, different than the first material, to the second array of sacrificial features so as to form a second mask defining a third array of apertures at the second number of features per unit area, the third array of apertures being interleaved with the second array of sacrificial features; and removing the second array of sacrificial features so as to form further apertures in the second mask that, with the third array of apertures, define a fourth array of apertures at a third number of features per unit area that is double the second number of features per unit area.

19. A method according to claim 18 wherein the steps of filling the second array of apertures, providing the substantially conformal coating to the second array of sacrificial features and removing the second array of sacrificial features are repeated one or more times.

20. A computer program storage medium comprising program code to control a lithographic cluster including a lithographic apparatus to perform a device manufacturing method comprising:

printing an array of sacrificial features at a first number of features per unit area on a first layer of a substrate;

providing a substantially conformal coating to the array of sacrificial features so as to form a first mask defining a first array of apertures at the first number of features per unit area, the first array of apertures being interleaved with the array of sacrificial features;

removing the sacrificial features so as to form further apertures in the first mask that, with the first array of apertures, define a second array of apertures at a second number of features per unit area that is double the first number of features per unit area;

providing a second mask that is above and covers, a selected part of the second array of holes; and processing a part of the first layer not covered by the first and second masks.

21. The computer program product according to claim 20, further comprising program code to perform providing a second mask that covers a selected part of the second array of apertures and the computer program code to perform processing a part of the first layer comprises computer program code to perform processing a part of the first layer not covered by the first and second masks.

* * * * *